US009177497B2

(12) United States Patent
Li et al.

(10) Patent No.: US 9,177,497 B2
(45) Date of Patent: Nov. 3, 2015

(54) METHOD FOR TESTING LCD PANEL

(71) Applicant: Shenzhen China Star Optoelectronics Technology Co., Ltd., Shenzhen, Guangdong (CN)

(72) Inventors: Zhiming Li, Shenzhen (CN); Hao Huang, Shenzhen (CN); Chang-hung Pan, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 252 days.

(21) Appl. No.: 13/702,299

(22) PCT Filed: Nov. 23, 2012

(86) PCT No.: PCT/CN2012/085177
§ 371 (c)(1),
(2) Date: Feb. 1, 2013

(87) PCT Pub. No.: WO2014/079048
PCT Pub. Date: May 30, 2014

(65) Prior Publication Data

US 2014/0139254 A1 May 22, 2014

(30) Foreign Application Priority Data

Nov. 22, 2012 (CN) .......................... 2012 1 0479145

(51) Int. Cl.
*G01R 31/26* (2014.01)
*G09G 3/00* (2006.01)
*G09G 3/36* (2006.01)

(52) U.S. Cl.
CPC .............. *G09G 3/006* (2013.01); *G09G 3/3648* (2013.01)

(58) Field of Classification Search
CPC ................ G09G 3/006; G09G 3/3648; G09G 2310/0262; G09G 2300/0809; G09G 2330/12; G01R 31/26
USPC ........................................................... 324/760
See application file for complete search history.

(56) References Cited

U.S. PATENT DOCUMENTS

| | | | | |
|---|---|---|---|---|
| 5,260,818 | A * | 11/1993 | Wu | 349/55 |
| 2002/0140691 | A1* | 10/2002 | Sato et al. | 345/212 |
| 2007/0170948 | A1* | 7/2007 | Chang et al. | 324/770 |
| 2010/0225770 | A1* | 9/2010 | Morimoto et al. | 348/189 |
| 2011/0007050 | A1* | 1/2011 | Sato et al. | 345/209 |
| 2011/0057680 | A1* | 3/2011 | Wang et al. | 324/760.01 |
| 2012/0062263 | A1* | 3/2012 | Lan et al. | 324/760.01 |
| 2013/0002738 | A1* | 1/2013 | Lu | 345/694 |
| 2013/0099816 | A1* | 4/2013 | Kawase et al. | 324/762.03 |

* cited by examiner

*Primary Examiner* — Son Le
(74) *Attorney, Agent, or Firm* — Andrew C. Cheng

(57) ABSTRACT

A method for testing an LCD panel is proposed. The method includes: dividing a scanning period into a first sub-period and a second sub-period; in the first sub-period, inputting a first scanning signal to a first set of scan lines, inputting a first testing signal to a first set of data lines, and inputting a second testing signal to a second set of data lines; and in the second sub-period, inputting a second scanning signal to a second set of scan lines, inputting a first scanning signal to a first set of scan lines, inputting a second testing signal to a first set of data lines, and inputting a first testing signal to a second set of data lines. By using the procedure, the present invention uses the testing method in the cell process to test the image blur phenomenon. This can improve the testing ability and raise the yield.

15 Claims, 4 Drawing Sheets

METHOD FOR TESTING LCD PANEL

BACKGROUND OF THE INVENTION

1. Field of the Invention

The invention relates to a display, and more particularly, to a method of testing an LCD panel.

2. Description of the Prior Art

In the conventional art, the liquid crystal display (LCD) panel after the cell manufacturing process will be later into a module manufacturing process in order to assemble the driver IC and LCD panel into an LCD display module. In the above-mentioned module manufacturing process, the IC and the LCD panel are firstly bonded and then a lighting testing method is performed to test the image blur phenomenon of the LCD module. The image blur phenomenon is that an image shown on the LCD display disappears gradually instead of disappearing immediately when the supplied voltage is cut off. The image blur phenomenon ruins the display quality.

But the program is: when the image blur phenomenon is identified in the lighting testing procedure, the driver IC and LCD panel have been assembled together and its hard to fix the LCD panel.

Moreover, the conventional 1D1G (1 data 1 gate) lighting testing procedure, currently used in the cell process, can be only utilized to light mono-color display, which can only display black, white, grey image. It means that conventional 1D1G (1 data 1 gate) lighting testing procedure cannot be used to test the image blur phenomenon.

SUMMARY OF THE INVENTION

It is therefore one of the primary objectives of the claimed invention to provide a testing method fir testing an LCD panel, which can utilize the 1D1G lighting testing procedure to test the image blur phenomenon in order to improve the testing ability and thus raise the yield.

According to an exemplary embodiment of the present invention, a method for testing a liquid crystal display (LCD) panel, comprises the steps of: in a 1D1G lighting testing procedure utilized in a cell process, dividing a plurality of scan lines of the LCD panel into a first set of scan lines and a second set of scan lines, and dividing a plurality of data lines of the LCD panel into a first set of data lines and a second set of data lines; periodically inputting a scanning signal to the first set of scan lines and the second set of scan lines, where a scan period is divided into a first sub-period and a second sub-period; in the first sub-period, inputting a first scanning signal to the first set of scan lines, inputting a first testing signal to the first set of data lines, and inputting a second testing signal to the second data lines; in the second sub-period, inputting a second scanning signal to the second set of scan lines, inputting the second testing signal to the first set of data lines, and inputting the first testing signal to the second set of data lines; wherein the first testing signal and the second testing signal respectively provide a first display image and a second display image, and the first display image and the second display image have different colors; wherein the first testing signal provides a white image and the second testing signal provides a black image; the LCD display panel is electrically connected to a lighting testing device, and the lighting testing device is utilized to provide the first scanning signal, the second scanning signal, the first testing signal, and the second testing signal.

In one aspect of the present invention, the first set of scan lines, the second set of scan lines, the first set of data lines, and the second set of data lines are respectively connected to different signal channels of a signal generator of the lighting testing device.

In another aspect of the present invention, the first set of scan lines, the second set of scan lines, the first set of data lines, and the second set of data lines are respectively connected to different signal channels of a signal generator of the lighting testing device via corresponding conducting glues on at least one edge of the LCD panel.

According to another exemplary embodiment of the present invention, a method for testing a liquid crystal display (LCD) panel is disclosed. The method comprises the steps of: in a 1D1G lighting testing procedure utilized in a cell process, dividing a plurality of scan lines of the LCD panel into a first set of scan lines and a second set of scan lines, and dividing a plurality of data lines of the LCD panel into a first set of data lines and a second set of data lines periodically inputting a scanning signal to the first set of scan lines and the second set of scan lines, were a scan period is divided into a first sub-period and a second sub-period; in the first sub-period, inputting a first scanning signal to the first set of scan lines, inputting a first testing signal to the first set of data lines, and inputting a second testing signal to the second data lines: in the second sub-period, inputting a second scanning signal to the second set of scan lines, inputting the second testing signal to the first set of data lines, and inputting the first testing signal to the second set of data lines; wherein the first testing signal and the second testing signal respectively provide a first display image and a second display image, and the first display image and the second display image have different colors.

In one aspect of the present invention, the first testing signal provides a white image and the second testing signal provides a black image.

In another aspect of the present invention, the first sub-period is a first half of the scanning period and the second sub-period is a second half of the scanning period.

In another aspect of the present invention, the second sub-period is a first half of the scanning period and the first sob-period is as second half of the scanning period.

In another aspect of the present invention, the first testing signal provides a black image and the second testing signal provides a white image.

In another aspect of the present invention, the first gob-period is a first half of the scanning period and the second sob-period is a second half of the scanning period.

In another aspect of the present invention, the second sub-period is a first half of the scanning period and the first sub-period is a second half of the scanning period.

In another aspect of the present invention, the first set of scan lines comprises odd sets of scan lines, the second set of scan lines comprises even sets of scan lines, the first set of data lines comprise odd sets of data lines, and the second set of data lines comprises even sets of data lines.

In another aspect of the present invention, the first set of scan lines comprises even sets of scan lines, the second set of scan lines comprises odd sets of scan lines, the first set of data lines comprise even sets of data lines, and the second set of data lines comprises odd sets of data lines.

In another aspect of the present invention, the LCD display panel is electrically connected to a lighting testing device, and the lighting testing device is utilized to provide the first scanning signal, the second scanning signal, the first testing signal, and the second testing signal.

In still another aspect of the present invention, the first set of scan lines, the second set of scan lines, the first set of data lines, and the second set of data lines are respectively connected to different signal channels of a signal generator of the lighting testing device.

In yet another aspect of the present invention, the first set of scan lines, the second set of scan lines, the first set of data lines, and the second set of data lines are respectively connected to different signal channels of a signal generator of the lighting testing device via corresponding conducting glues on at least one edge of the LCD panel.

In contrast to the prior art, the present invention utilizes a first set of scan line to transfer a first scanning signal, utilizes a first set of data lines to transfer a first testing signal, and utilizes a second set of data lines to transfer a second testing signal in a first sub-period; utilizes a second set of scan line to transfer a second scanning signal, utilizes a first set of data lines to transfer a second testing signal, and utilizes a second set of data lines to transfer a first testing signal in a second sub-period. In this way, the present invention can display a first image and a second image having different colors in the cell process. Therefore, when the supplied voltage is cut off the image blur phenomenon can be tested. In this way, the present invention, can utilize the 1D1G lighting testing method in the cell process to test the image blur phenomenon of the LCD panel to improve the testing ability and thus raise the yield.

DETAILED DESCRIPTION OF THE PREFERRED EMBODIMENT

These and other objectives of the claimed invention, will no doubt become obvious to those of ordinary skill in the art after reading the following detailed description of the preferred embodiment that is illustrated in the various figures and drawings.

Figure 1:
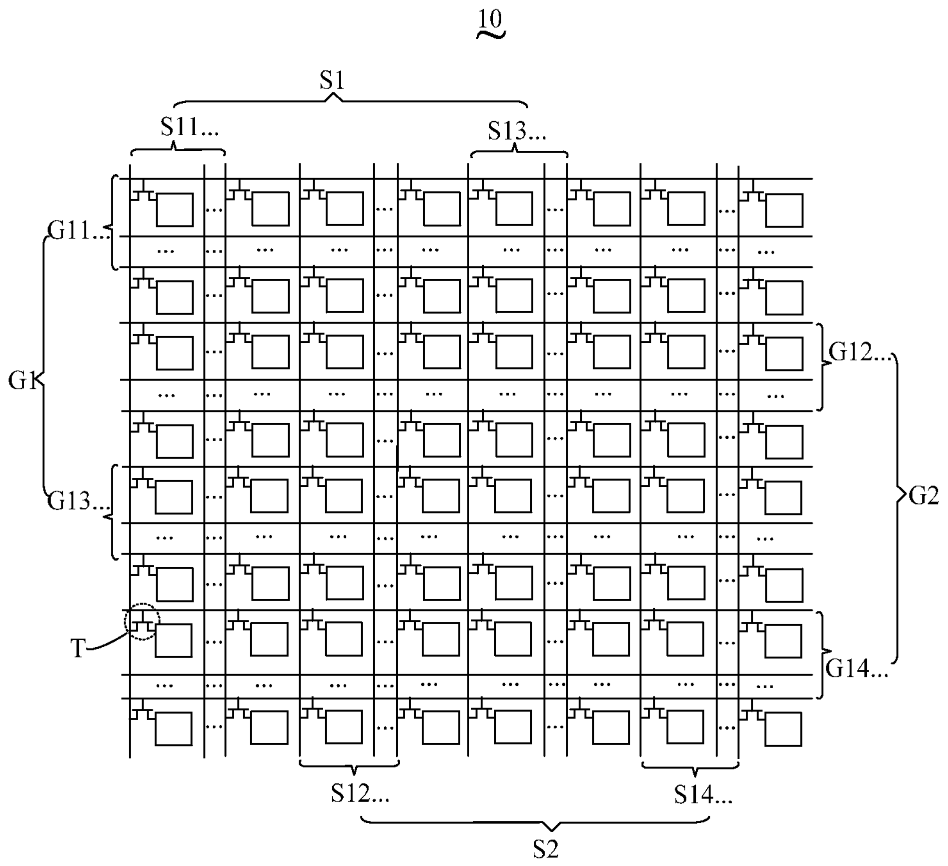
FIG. 1 is a diagram illustrating the theory of a testing method for an LCD panel according to the present invention.
Figure 2:
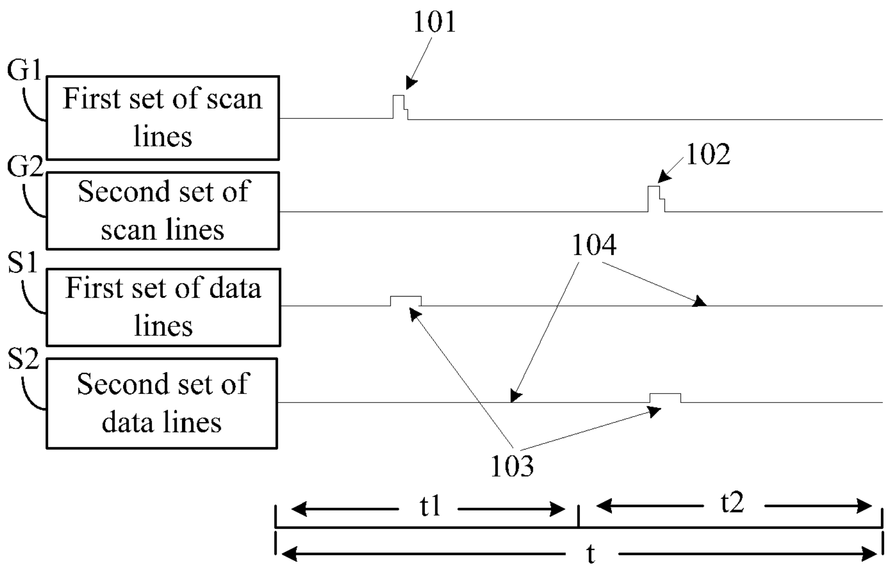
FIG. 2 is a diagram showing waveforms of signals inputting to data lines and scan lines according to the present invention.

Please refer to FIG. 1 in conjunction with FIG. 2. FIG. 1 is a diagram illustrating a method for testing an LCD panel according to the present invention. FIG. 2 is a diagram showing waveforms of signals inputting to data lines and scan lines according to the present invention. Please refer to FIG. 1. The LCD display panel 10 comprises a plurality of scan lines G11-G14, a plurality of data lines S11-S14 intersected with the scan lines G11-G14, and a plurality of thin-film transistors (TFT) T. The scan lines G11 are a first set of scan lines in the first bonding area. The scan lines G12 are a second set of scan lines in the second bonding area. The scan lines G13 are a third set of scan lines in the third bonding area. The scan lines G14 are a fourth set of scan lines in the fourth bonding area. Similarly, the data lines S11 are a first set of data lines corresponding to red, green, and blue colors (RGB) in the first bonding area. The data lines S12 are a second set of RGB data lines in the second bonding area. The data lines S13 are a third set of RGB data lines in the third bonding area. The data lines S14 are a fourth set of RGB data lines in the fourth bonding area. The scan lines G11-G14 are respectively connected to the gates of the TFTs T, and the data lines S11-S14 are respectively connected to the sources of the TFTs T.

In this embodiment, the present invention utilizes the 1D1G lighting testing method in the cell process to test the LCD panel 10. That is, a set of scan lines or a set of data lines corresponds to a signal line of a bonding area. To speak more specifically, the scan lines G11-G14 are divided into a first set of scan lines G1 and a second set of scan lines G2, and the data lines S11-S14 are divided into a first set of data lines S1 and a second set of data lines S2. Please note, in this embodiment, the first set of scan lines G1 comprises odd sets of scan lines such as G11 and G13, the second set of scan lines G2 comprises even sets of scan lines such as G12 and G14, the first set of data lines S1 comprises odd set of data lines such as S11 and S13, and the second set of data lines S2 comprises even sets of data lines such as S12 and S14.

It should be noted that, in this embodiment, the first set of scan line G1 can comprise even sets of scan lines, and the second set of scan line G2 can comprise odd sets of scan lines. The first set of data lines can comprise even sets of data lines, and the second set of data lines can comprise odd sets of data lines. Furthermore, the first set of scan line G1 can comprise consecutive sets of scan lines such as G11 and G12, and the second set of scan line G2 can comprise consecutive sets of scan lines such as G13 and G14. The first set of data line S1 can comprise consecutive sets of data lines such as S11 and S12, and the second set of data line S2 can comprise consecutive sets of data lines such as S13 and S14. These changes all obey the spirit of the present invention.

In this embodiment, a scanning signal is periodically inputted into the first set of scan lines G1 and the second set of scan lines G2. A scanning period is divided into a first sub-period t1 and a second sub-period t2 as shown in FIG. 2. Different testing signals are respectively inputted into the first set of data lines S1 and the second set of data lines S2 in the first sub-period t1 and the second sub-period t2, respectively, such as the first testing signal 103 and the second testing signal 104 as shown in FIG. 2. The first testing signal 103 and the second testing signal 104 respectively provide a first image and a second image having different colors. Therefore, the present invention LCD panel 10 can display images having different colors.

Specifically, please refer to FIG. 1 and FIG. 2. In the first sub-period 11, the first scanning signal 101 is inputted to the first set of scan lines G1 and thus transferred to the gates of TFTs T connected to the first set of scan lines G1 such that the TFTs T are turned on. In addition, the first testing signal 103 is inputted into the first set of data lines S1 and thus transferred, to the sources of the TFTs T electrically connected to the first set of data lines S1 such that the pixels electrically connected to the first set of scan lines G1 and the first set of data lines S1 display a first image. Simultaneously, the second testing signal 104 is inputted into the second set of data lines S2 and thus transferred to the sources of TFTs T electrically connected to the second set of data lines S2 such that the pixels electrically connected to the first set of scan lines G1 and the second set of data lines S2 display a second image.

Similarly, in the second sub-period t2, the second scanning signal 102 is inputted to the second set of scan lines G2 and thus transferred to the gates of TFTs T connected to the second set of scan lines G2 such that the TFTs T are turned on. In addition, the second testing signal 104 is inputted into the first set of data lines S1 and thus transferred to the sources of the TFTs T electrically connected to the first set of data lines S1 such that the pixels electrically connected to the second set of scan lines G2 and the first set of data lines S1 display the second image. Simultaneously, the first testing signal 103 is inputted into the second set of data lines S2 and thus transferred to the sources of TFTs T electrically connected to the second set of data lines S2 such that the pixels electrically connected to the second set of scan lines G2 and the second set of data lines S2 display the first image.

It should he noted that, in this embodiment, the first testing signal 103 and the second testing signal 104 are signals having different voltages. They can be square wave signals or VCOM signals. When a square wave signal is inputted to the TFTs T, a white image is displayed. When a VCOM signal is inputted to the TFTs T, a black image is displayed. Therefore, according to an embodiment of the present invention, the first testing signal 103 and the second testing signal 104 can have two situations.

Situation 1: The first testing signal 103 is a square wave signal, which provides a white image. The second testing signal 104 is a VCOM signal, which provides a black image.

Situation 2: The first testing signal 103 is a VCOM wave signal, which provides a black image. The second testing signal 104 is a square signal, which provides a white image.

Figure 3:
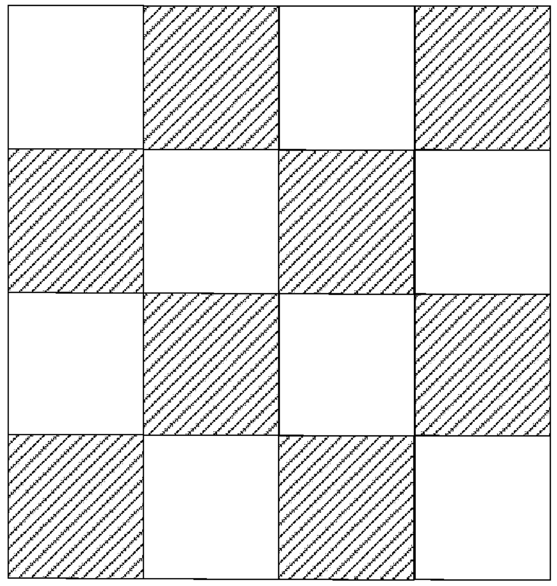
FIG. 3 is a diagram showing an effect generated by the testing method according to the present invention.

Therefore, when the first testing signal 103 provides a white image and the second testing signal 104 provides a black image, the present invention LCD panel 10 displays an effect shown in FIG. 3. As shown in FIG. 3, the black image and the white image are displayed in intervals on the LCD panel 10. To speak more specifically, when the scan lines turned on the TFTs T and the first testing signal 103 is inputted to the TFTs T via the data lines, the corresponding pixels display a white image. And when the scan lines turned on the TFTs T and the second testing signal 104 is inputted to the TFTs T via the data lines, the corresponding panels display a black image.

Figure 4:
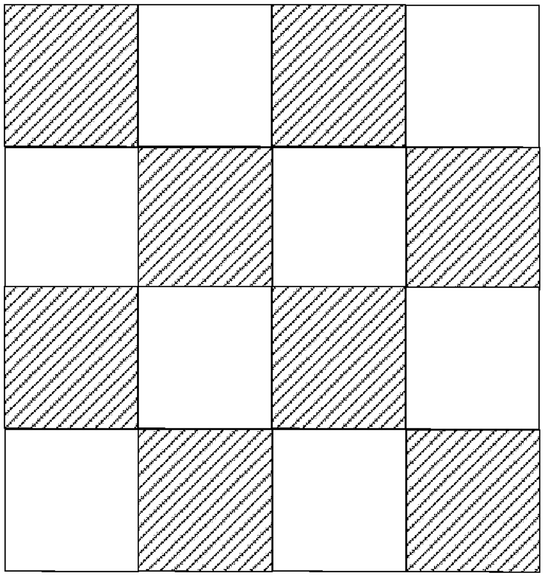
FIG. 4 is a diagram showing another effect generated by the testing method according to the present invention.

On the other hand, when the first testing signal 103 provides a black image and the second testing signal 104 provides a white signal, the effect shown on the LCD panel 10 is shown in FIG. 4. It can he seen that the effect shown in FIG. 4 is opposite to the effect shown in FIG. 3.

In this embodiment, the first sub-period t1 is the first half of the scanning period, and the second sub-period t2 is the second half of the scanning period. That is, the first sub-period and the second sub-period sums up to a complete scanning period t. In another embodiment, the first sub-period t1 is the second half of the scanning period, and the second sub-period t2 is the first half of the scanning period. This change also obeys the spirit of the present invention. Furthermore, the present invention does not limit the actual duration of the first sub-period and the second sub-period. For example, the first sub-period t1 can be ⅓ of the complete scanning period t, and the second sub-period t2 can be ⅔ of the scanning period t. This change also obeys the spirit of the present invention.

Similarly, when the first set of scan lines G1 comprise even sets of scan lines and the second set of scan lines G2 comprise odd sets of scan lines, the first set of data lines comprise even sets of data lines and the second set of data lines comprise odd sets of data lines, or the first set and the second set of scan lines G1 and G2 comprise consecutive sets of scan lines and the first set and second set of data lines S1 and S2 comprise consecutive sets of data lines, the effects shown on the LCD display panel 10 can also be the effects shown in FIG. 3 and FIG. 4.

In another embodiment, if the LCD display panel only comprises scan lines in a single bonding area and RGB data lines in a single bonding area, the present invention can also divide the gate lines and RGB data lines into multiple sets and then utilize the 1D1G lighting testing method to test the LCD panel. The detailed division mechanism 1 the lighting testing method have been illustrated in the above disclosure, and further discussion is omitted here.

Therefore, the present invention divides a plurality of scan lines into a first set of scan lines and a second set of scan lines, divides a plurality of data lines into a first set of data lines and a second set of data lines, periodically inputting a scanning signal into the first set and second set of scan lines, inputting different testing signals into the first and the second sets of data lines in different sub-periods, respectively. This allows the LCD panel 10 to display different images having different colors. In this way, the 1D1G lighting testing method can be utilized in the cell process to test whether the LCD panel has an image blur phenomenon.

Figure 5:
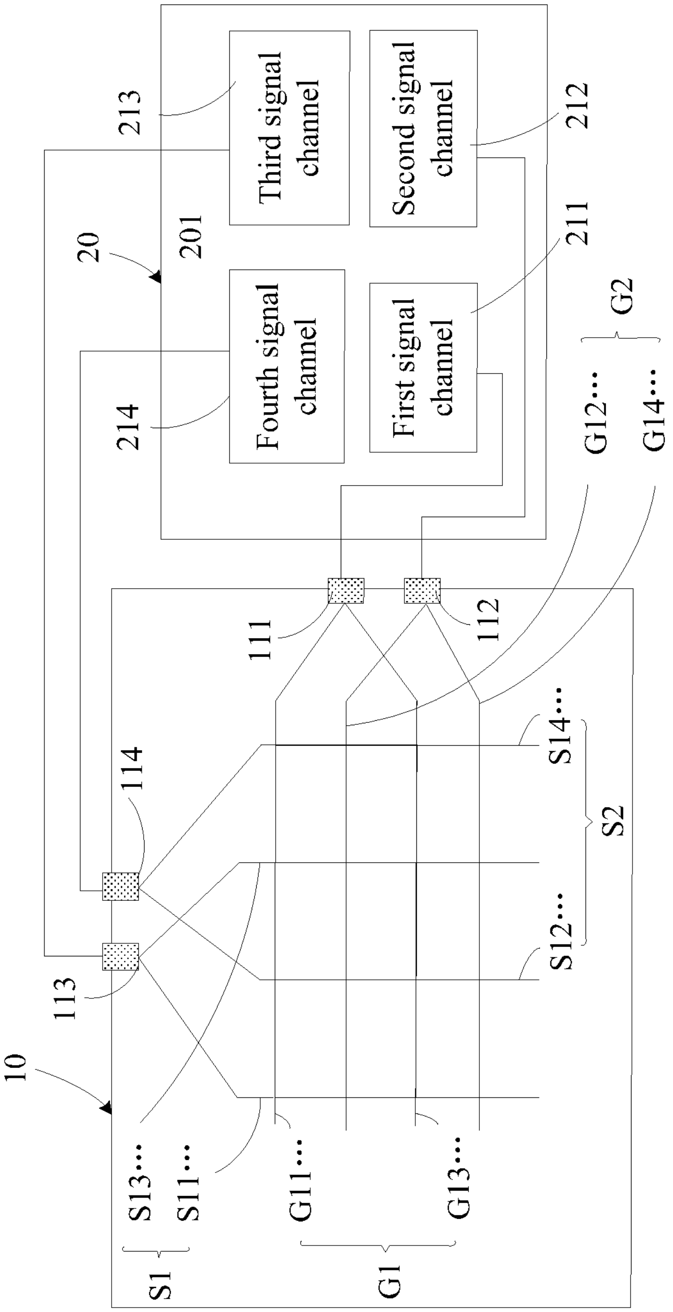
FIG. 5 is a diagram showing the LCD panel and a light testing device according to the present invention.

Please refer to FIG. 5, which is a diagram showing a lighting testing device and an LCD panel according to the present invention. As shown in FIG. 5, the present invention LCD panel 10 is electrically connected to the lighting testing device 20. The lighting testing device 20 is used to provide the first scanning signal 101, the second scanning signal 102, the first testing signal 103 and the second testing signal 104 to the LCD panel 10.

In this embodiment, the first set of scan lines G1, the second set of scan lines G2, the first set of data lines S1 and the second set of data lines S2 are respectively connected to different signal channels of the signal generator 201 of the lighting testing device 20.

Specifically, a plurality of conducting glues 111, 112, 113 and 114 are put on the edge of the LCD panel 10. The first set of scan lines G1 is electrically connected to the first signal channel 211 of the signal generator 201 via the conducting glue 111. The second set of scan lines G2 is electrically connected to the second signal channel 212 of the signal generator 201 via the conducting glue 112. The first set of data lines S1 is electrically connected to the third signal channel 213 of the signal generator 201 via the conducting glue 113. The second set of data lines S2 is electrically connected to the fourth signal channel 214 of the signal generator 201 via the conducting glue 114.

The aforementioned signal channels can be established by using the software of the signal generator 201. Each of the signal channels can be used to transfer different signals. Optimally, the first signal channel 211 is used to transfer the first scanning signal 101 in the first sub-period t1, and the second signal channel 212 is used to transfer the second scanning signal 102 in the second sub-period t2. The third signal channel 213 is used to transfer the first testing signal 103 in the first period t1 and transfer the second testing signal 104 in the second period t2, and the fourth signal channel 214 is used to transfer the second testing signal 104 in the first period t1 and transfer the first testing signal 103 in the second period t2.

By establishing different signal channels in the signal generator 201 and utilizing these channels to transfer different signals, the present invention can show a chessboard-like image on the LCD panel to test Whether the LCD panel has image blur phenomenon. It means, the present invention is able to utilize 1D1G lighting testing method in the cell process to perform the image blur test the LCD panel 10. This improves the testing ability and thus improves the yield.

Although the present invention has been explained by the embodiments shown in the drawings described above, it should be understood to the ordinary skilled person in the art that the invention is not limited to the embodiments, but rather various changes or modification thereof are possible without departing from the spirit of the invention. Accordingly, the scope of the invention shall be determined only by the appended claims and their equivalents.

What is claimed is:

1. A method for testing a liquid crystal display (LCD) panel, comprising:
- in a lighting testing procedure utilized in a cell process, dividing a plurality of scan lines of the LCD panel into a first set of scan lines and a second set of scan lines, and dividing a plurality of data lines of the LCD panel into a first set of data lines and a second set of data lines;
- periodically inputting a scanning signal to the first set of scan lines and the second set of scan lines, where a scan period is divided into a first sub-period and a second sub-period;
- in the first sub-period, inputting a first scanning signal to the first set of scan lines, inputting a first testing signal to the first set of data lines, and inputting a second testing signal to the second set of data lines;
- in the second sub-period, inputting a second scanning signal to the second set of scan lines, inputting the second testing signal to the first set of data lines, and inputting the first testing signal to the second set of data lines;
- wherein the first testing signal and the second testing signal respectively provide a first display image and a second display image, and the first display image and the second display image have different colors so as to show different chessboard-like images on the liquid crystal display panel respectively in the first sub-period and the second sub-period;
- wherein the first testing signal provides a white image and the second testing signal provides a black image;
- the LCD display panel is electrically connected to a lighting testing device, and the lighting testing device is utilized to provide the first scanning signal, the second scanning signal, the first testing signal, and the second testing signal.

2. The method of claim 1, wherein the first set of scan lines, the second set of scan lines, the first set of data lines, and the second set of data lines are respectively connected to different signal channels of a signal generator of the lighting testing device.

3. The method of claim 2, wherein the first set of scan lines, the second set of scan lines, the first set of data lines, and the second set of data lines are respectively connected to the different signal channels of the signal generator of the lighting testing device via corresponding conducting glues on at least one edge of the LCD panel.

4. A method for testing a liquid crystal display (LCD) panel, comprising: in a lighting testing procedure utilized in a cell process, dividing a plurality of scan lines of the LCD panel into a first set of scan lines and a second set of scan lines, and dividing a plurality of data lines of the LCD panel into a first set of data lines and a second set of data lines; periodically inputting a scanning signal to the first set of scan lines and the second set of scan lines, where a scan period is divided into a first sub-period and a second sub-period;
- in the first sub-period, inputting a first scanning signal to the first set of scan lines, inputting a first testing signal to the first set of data lines, and inputting a second testing signal to the second set of data lines;
- in the second sub-period, inputting a second scanning signal to the second set of scan lines, inputting the second testing signal to the first set of data lines, and inputting the first testing signal to the second set of data lines;
- wherein the first testing signal and the second testing signal respectively provide a first display image and a second display image, and the first display image and the second display image have different colors so as to show different chessboard-like images on the liquid crystal display panel respectively in the first sub-period and the second sub-period.

5. The method of claim 4, wherein the first testing signal provides a white image and the second testing signal provides a black image.

6. The method of claim 5, wherein the first sub-period is a first half of the scanning period and the second sub-period is a second half of the scanning period.

7. The method of claim 5, wherein the second sub-period is a first half of the scanning period and the first sub-period is a second half of the scanning period.

8. The method of claim 4, wherein the first testing signal provides a black image and the second testing signal provides a white image.

9. The method of claim 8, wherein the first sub-period is a first half of the scanning period and the second sub-period is a second half of the scanning period.

10. The method of claim 8, wherein the second sub-period is a first half of the scanning period and the first sub-period is a second half of the scanning period.

11. The method of claim 9, wherein the first set of scan lines comprises odd sets of scan lines, the second set of scan lines comprises even sets of scan lines, the first set of data lines comprise odd sets of data lines, and the second set of data lines comprises even sets of data lines.

12. The method of claim 9, wherein the first set of scan lines comprises even sets of scan lines, the second set of scan lines comprises odd sets of scan lines, the first set of data lines comprise even sets of data lines, and the second set of data lines comprises odd sets of data lines.

13. The method of claim 4, wherein the LCD display panel is electrically connected to a lighting testing device, and the lighting testing device is utilized to provide the first scanning signal, the second scanning signal, the first testing signal, and the second testing signal.

14. The method of claim 13, wherein the first set of scan lines, the second set of scan lines, the first set of data lines, and the second set of data lines are respectively connected to different signal channels of a signal generator of the lighting testing device.

15. The method of claim 14, wherein the first set of scan lines, the second set of scan lines, the first set of data lines, and the second set of data lines are respectively connected to the different signal channels of the signal generator of the lighting testing device via corresponding conducting glues on at least one edge of the LCD panel.

* * * * *